United States Patent
Nakanishi et al.

(10) Patent No.: US 8,005,367 B2
(45) Date of Patent: Aug. 23, 2011

(54) BI-DIRECTIONAL OPTICAL MODULE WITH IMPROVED OPTICAL CROSSTALK

(75) Inventors: Hiromi Nakanishi, Yokohama (JP); Toshiaki Kihara, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 696 days.

(21) Appl. No.: 12/010,525

(22) Filed: Jan. 25, 2008

(65) Prior Publication Data

US 2008/0187315 A1      Aug. 7, 2008

(30) Foreign Application Priority Data

Jan. 25, 2007 (JP) .................. 2007-015575

(51) Int. Cl.
*H04B 10/12* (2006.01)
(52) U.S. Cl. ........................ 398/138; 359/152
(58) Field of Classification Search .................. 398/139, 398/135, 138, 140, 41, 42
See application file for complete search history.

(56) References Cited

U.S. PATENT DOCUMENTS

| | | | |
|---|---|---|---|
| 7,093,988 B2 | 8/2006 | Tsumori | |
| 2003/0202750 A1* | 10/2003 | Okada et al. | 385/49 |
| 2004/0071413 A1* | 4/2004 | Tsumori | 385/93 |
| 2004/0213583 A1* | 10/2004 | Guenter | 398/202 |
| 2007/0146881 A1* | 6/2007 | Tanaka et al. | 359/487 |

FOREIGN PATENT DOCUMENTS

JP       2004-271921       9/2004

* cited by examiner

*Primary Examiner* — Ken Vanderpuye
*Assistant Examiner* — Abbas H Alagheband
(74) *Attorney, Agent, or Firm* — Venable LLP; Michael A. Sartori; Leigh D. Thelen

(57) ABSTRACT

The bi-directional optical module, which installs the receiver and the transmitter within one package, is disclosed with an improved optical crosstalk. The optical module provides a lens, a WDM filter and a photodiode (PD) on an axis of the single mode fiber coupled with the module, while, a laser diode (LD) in a position perpendicular to the optical axis. The WDM filter provides a multi-layered optical film on a primary surface and an edge in a side far from the LD and the (PD) makes an obtuse angle to the primary surface so as to prevent light from the LD and reflected at this edge from entering the PD.

5 Claims, 4 Drawing Sheets

BI-DIRECTIONAL OPTICAL MODULE WITH IMPROVED OPTICAL CROSSTALK

BACKGROUND OF THE INVENTION

1. Field of the Invention

The present invention relates to a bidirectional optical module for the signal optical fiber which includes a wavelength division multiplexed (WDM) filter.

2. Related Prior Arts

The PON (Passive Optical Network) system has been introduced in the network system between the center and the subscribers, which is typically realized in the FTTH (Fiber to the Home) and provides higher speed and larger capacity communication with a reasonable cost. The PON system implements optical couplers in the communication line to draw the fiber into a plurality of users, which is equivalent to a system where the plurality of users shares the single fiber connected to the center station. The PON system may reduce the count of optical fibers pulled out from the center station, thus, realizes the advanced communication service with higher speed with reduced cost comparable to that using the metal cable. Further, the PON system is one of the WDM system where different wavelengths, one is 1.31 µm band and the other is 1.55 or 1.49 µm band, to transmit and receive optical signals within in the single fiber, which may further enhance the communication capacity.

The bi-direction module for the single optical fiber, which is used in such a PON system, has a configuration that the transmission light emitted from a laser diode (LD) is coupled with the optical fiber, while, the receiving light provided from the optical fiber is coupled with the photodiode (PD). Various techniques and apparatuses have been reported to couple the light with the device or the optical fiber.

For instance, one typical example is an optical module that implements a transmitter optical sub-assembly (TOSA) and a receiver optical sub-assembly (ROSA) each having individual package, what is called as a two-package module. This two-package module is quite popular in the field because simple and conventional assembly techniques are applicable. However, this two-package module follows a cost-demerit because it applies two can packages for the TOSA and the ROSA even the packages are popular and available in the market. Accordingly, another type of the bi-directional module has been proposed, in which the single package installs both the LD and the PD, what is called as the one-package module. Japanese Patent Application published as JP-2004-271921A and U.S. Pat. No. 7,093,988, have disclosed such one-package bi-directional module.

The optical module disclosed in JP-2004-271921A provides a beam splitter set in the side of the sub-carrier that has a step. The transmitting light from the LD, which is mounted on the top of the sub-carrier, reaches the lens after the reflection by the beam splitter. While, the receiving light provided from the fiber enters the PD mounted on the step of the sub-carrier after it concentrated by the lens and the beam splitter.

The optical module disclosed in the U.S. Pat. No. 7,093,988 implements a WDM filter inclined by a preset angle with respect to the optical axis of the optical fiber selectively passes the receiving light from the fiber and reflects the transmitting from the LD. Inner cap, by surrounding the PD, isolates the PD from the stray light scattered invading from the outside.

The one-package module mentioned above is able to miniaturize the whole body, but has a weak point to degrade the crosstalk where the transmitting light emitted from the LD is diffusely reflected by the WDM filter to cause the stray and the PD receives this stray light. This is because of the adjacent mounting between the LD and the PD.

The present bi-directional module with the one-package configuration, in which the LD and the PD are adjacently installed, may improve the optical crosstalk performance.

SUMMARY OF THE INVENTION

A bi-directional optical module comprises a semiconductor laser diode (LD) to emit first light with a first wavelength to a single fiber, a semiconductor photodiode (PD) to receiver second light with a second wavelength different form the first wavelength from the single fiber, and a wavelength division multiplexing (WDM) filter to reflect the first light toward the single fiber and to transmit the second light toward the PD. The WDM filter of the present optical module has a feature that an edge surface makes an obtuse angle to a primary surface, where an optical film showing the WDM function is formed.

The optical module of the present invention, because the WDM filter in the edge surface thereof has the obtusely angle to the primary surface thereof, the light reaching this edge and reflected thereat is prevented from coupling with the PD, which enhances the optical crosstalk performance of the bi-directional module.

DESCRIPTION OF PREFERRED EMBODIMENTS

Figure 1:
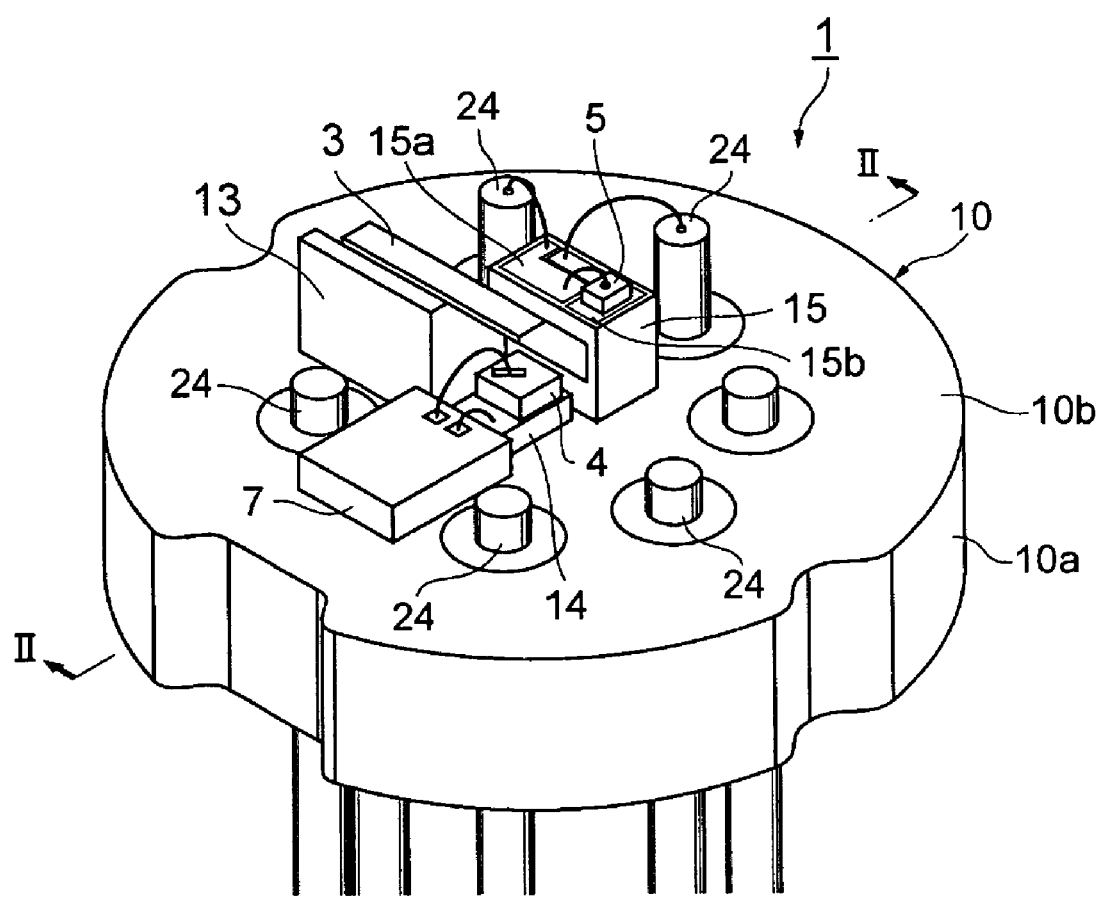
FIG. 1 is a perspective view showing the inside of the bi-directional optical module according to the present invention.

FIG. 1 is a perspective view showing an inside of an optical module 1 according to the present invention. The optical module 1 includes, on a primary surface 10b of a disk-shaped stem 19, both photodiode (PD) 4 as a light-receiving device and laser diode (LD) 5 as a light-transmitting device and a WDM filter 3 arranged between these devices.

An optical arrangement of the module 1 will be described as referring to FIG. 2. The light emitted from the LD with a wavelength of $\lambda_1$ advances on the optical axis Tx of the LD and is reflected by a multi-layered optical film 7 formed on the surface of the WDM filter 3. The light bent whose axis Tx is bent by 90° by the WDM filter 3 advances upward, and is concentrated on the end of the single mode fiber (SMF) F by the lens 2.

While, the light provided from the end of the fiber F, whose wavelength is $\lambda_2$ different from $\lambda_1$, is concentrated by the lens 2, passing through the WDM filter 3 and advances to the PD 4 arranged below the WDM filter 3. The virtual line connecting the SMF and PD 4 coincides with the optical axis Rx of the PD, and a portion of the line from the WDM filter 3 to the SMF coincides with the optical axis Tx of the LD bent by 90° with the WDM filter 3.

The WDM filter 3 comprises a base 6 made of material transparent for the light with the wavelength $\lambda_2$ and a multi-layered optical film 7 formed on the primary surface 6a of the base 6. The function of the WMD filter 3, which wavelengths including $\lambda_1$ may be reflected thereat and other wavelengths including $\lambda_2$ may be transmitted therethrough, depends on the materials of each layer, the thickness and the refractive index thereof.

Referring to FIG. 1 again, the arrangement of the optical module 1 will be described in detail. The LD 5 is mounted on the primary surface 10b of the stem 10 by interposing a LD sub-mount 15 made of ceramics with conductive patterns, 15a and 15b, on the top surface thereof. One of conductive patterns 15b directly mounts the LD 5. The LD 5 provides electrodes in the bottom and the top surfaces thereof. Thus, the conductive patter 15b is electrically and directly connected to the bottom electrode of the LD, while, this conductive pattern 15b is wire-bonded to one of lead pins 24 with a bonding wire.

Another bonding wire connects to top electrode of the LD 5 with the other conductive pattern 15a which is wire-bonded to one of lead pins 24 different from that connected to the other conductive pattern 15b. Thus, the LD may be driven by the signal provided between two lead pins 24. The width of these lead pins extruding from the primary surface 10b of the stem is set longer with respect to the other lead pins, which not only facilitates the process of the wire-bonding but shorten the width of the bonding wire to restrict the degradation of the signal quality applied to these lead pins 24.

The PD 4 is also mounted on the primary surface 10b of the stem 10 by interposing the PD sub-mount 14 made of insulating material with conductive patterns on the top thereof. A bonding wire directly connects, without any intermediate ports, one of electrode of the PD 4 to a pre-amplifier 7 mounted immediate side of the PD 4 on the primary surface 10b of the stem 10. Another bonding wire extends from the conductive pattern on the PD sub-mount 14, where the PD 4 is mounted thereon and is electrically connected to the bottom electrode of the PD 4, to the pre-amplifier 7. The outputs of the pre-amplifier, which are complementary to each other, are conducted to lead pins 24 positioned in both sides of the pre-amplifier with bonding wires, which is omitted in FIG. 1.

In the embodiment shown in FIG. 1, the bias voltage to enhance the conversion gain of the PD 4 may be supplied through the pre-amplifier 7. However, the module 1 may provide the bias voltage directly to the conductive pattern on the PD sub-mount 14 from the lead pin, or, in another arrangement, the PD sub-mount 14 may be a die-capacitor, which includes two electrodes putting a die-electric material therebetween, and the upper electrode of this die-capacitor may mount the PD 4 thereon. In this case, the die-capacitor may be a bypassing capacitor for the bias voltage to the PD 4.

The WDM filter 3 is arranged on a slope on the filter sub-mount 13, whose angle is substantially 45° with respect to the primary surface 10b of the stem 10. The filter sub-mount 13 may be made of metal or ceramics. The stem 10 mounts the filter sub-mount 13 in a position offset from the center of the primary surface 10b. Thus, the WDM filter 3 is fixed in an end portion thereof to this slope. Although FIG. 1 illustrates one sub-mount 13 only in the far side of the PD 4, the module 1 may provide another filter sub-mount 13' in the other side to put the PD 4 therebetween. In this arrangement, both end portions of the WDM filter 3 are fixed to the slope of respective filter sub-mount 13 to make a space under the WDM filter 3 to mount the PD 4 therein.

Figure 2:
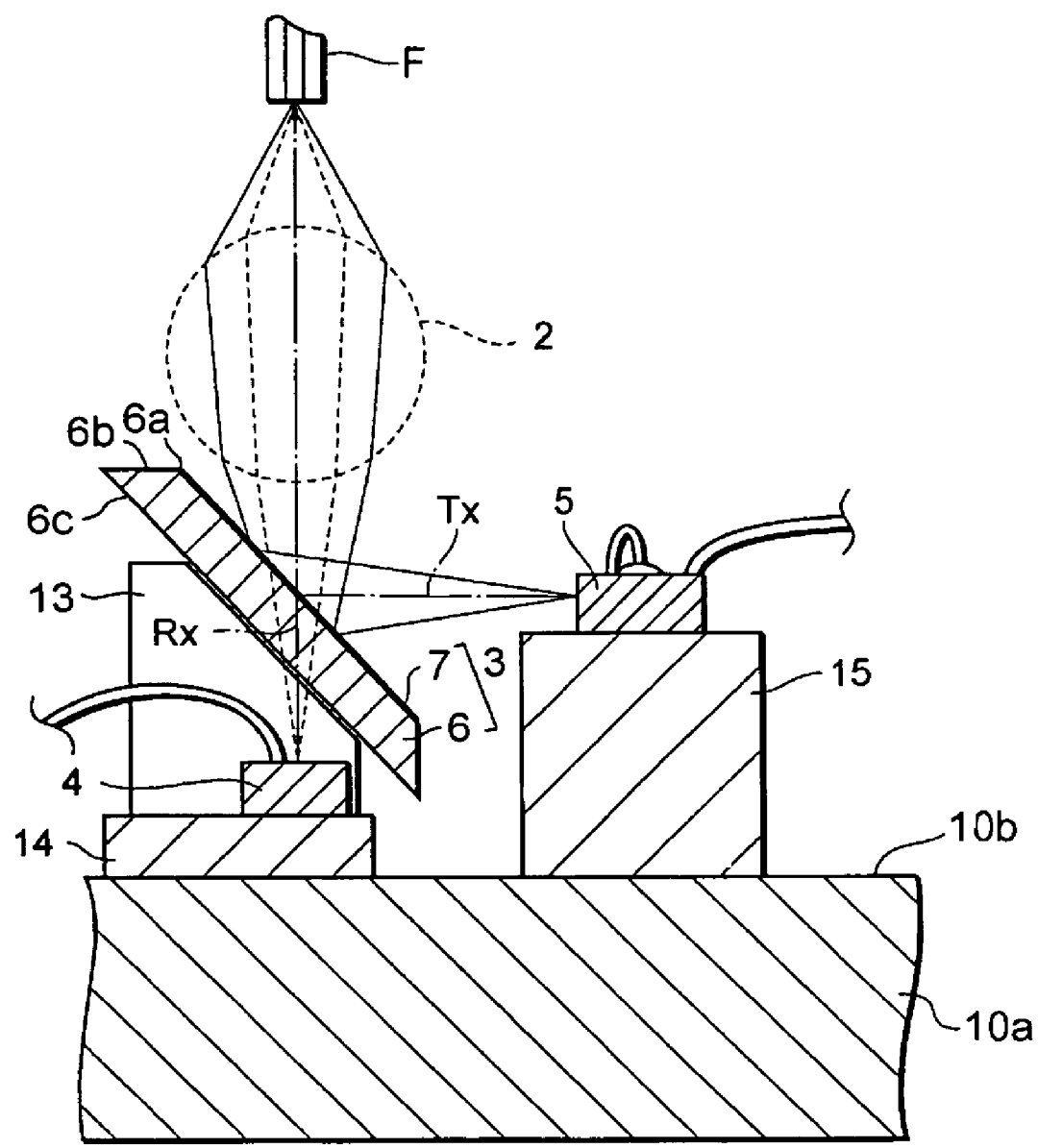
FIG. 2 schematically shows an optical configuration of the devices within the optical module.
Figure 4A:
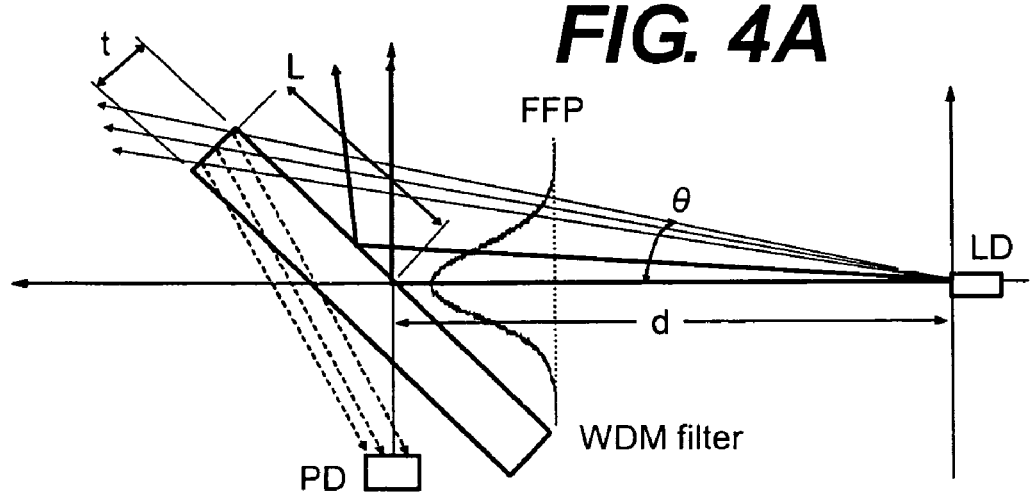
FIG. 4A is a ray tracing of the light from the LD for the WDM filter with the conventional edge shape.

In the present embodiment of the optical module 1, the WDM filter 3 in one edge surface 6b thereof makes an obtuse angle with the primary surface 6a, as shown in FIG. 2. This is to prevent the light from the LD 5 and reflected at the edge surface 6b entering the PD 4 to degrade the optical crosstalk. The mechanism of the degradation of the crosstalk in the optical module 1 will be described below as referring to FIGS. 4A to 4C.

FIG. 4 schematically illustrates the ray tracing of the light emitted from the LD for the WDM filter 3 with a conventional edge surface 6b which makes substantially right angle with respect to the primary surface 6a. Assuming the LD 5 has an edge emitting type, the light emitted from the LD 5 shows a far-field pattern spreading out as the light emitted from the point source at the edge of the LD 5. The intensity behavior of this far-field patter may be approximated by the Gaussian distribution with dispersion thereof reaching about 30°, which is equivalent to a full angle of about 50° where the intensity of the light becomes $1/e^2$ with respect to the maximum.

When such spreading light with the wavelength $\lambda_1$ enters the WDM filter 3, even if the multi-layered film 7 shows the reflectivity of nearly 100%, portion of the light may transmit the multi-layered film 7. Assuming the size of the WDM filter 3, that is, the width L from the center to the edge of the WDM filter 3 is 0.5 mm and the thickness t is 0.2 mm, and the distance d from the edge of the LD 5 to the center of the WDM filter 3 is 0.6 mm, portion of the light with the angle from 13 to 250 may reach the edge surface 6b of the WDM filter 3, which becomes about 30% of the whole light. The greater part of the light with the spreading angle 13 to 25° is reflected by the film 7. Moreover, the whole light reflected at the edge surface 6b does not couple with the surface of the PD 4. However, a substance portion of the light emitted from the LD 5 may couple with the PD 4 for the conventional configuration of the WDM filter 3.

Figure 4B:
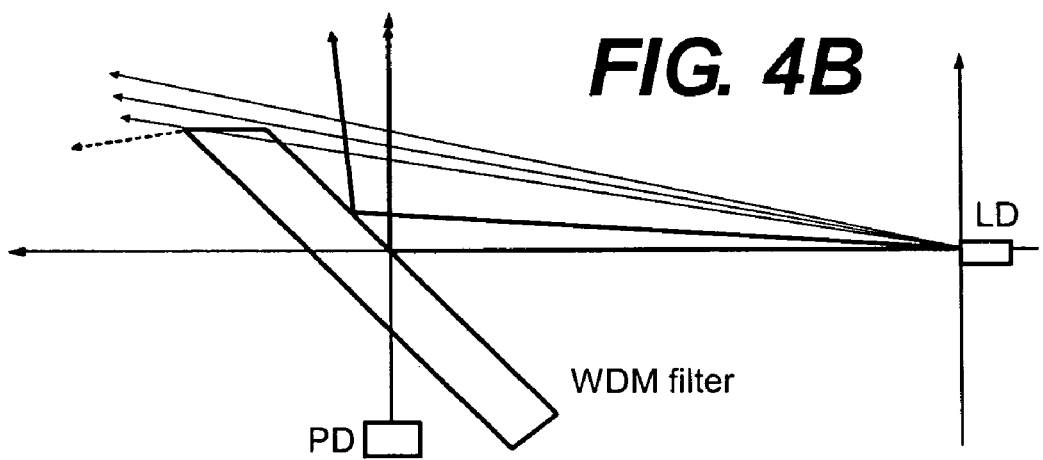
FIG. 4B is a ray tracing of the light from the LD for the WDM filter of the present invention.

FIG. 4B schematically illustrates the ray tracing for the configuration of the WDM filter 3 according to the present invention. That is, the WDM filter according to the present invention provides the edge surface making the obtuse angle with respect to the primary surface 6a. Other geometrical conditions are same as those shown in FIG. 4A. The edge surface 6b with the obtuse angle to the primary surface 6a may prevent the light reflected thereat from coupling with the surface of the PD 4. Because the WDM filter 3 is set at 45° with respect to the primary surface 10b of the stem 10, which is substantially identical with the surface of the PD 4, the obtuse angle greater than 135° may prevent the light from coupling with the PD 4 independent of the other geometrical conditions, namely, the size of the WDM filter 3 and the distance between the WDM filter 3 and the LD 5.

Figure 4C:
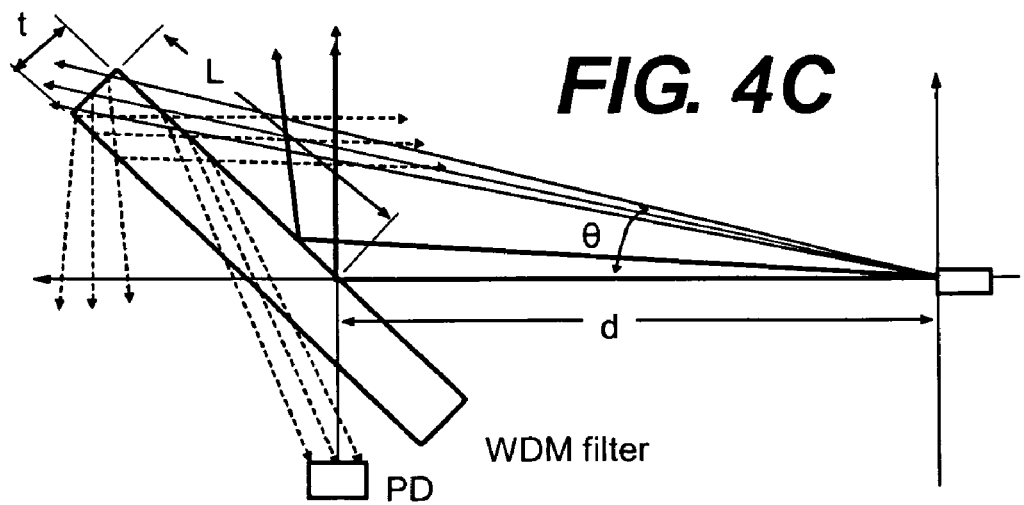
FIG. 4C is a ray tracing of the light from the LD for the WDM filter with a modified shape.

FIG. 4C schematically illustrates the ray tracing for a condition where the size of the WDM filter 3, in particular the width L thereof, is set larger. Even in the conventional shape of the WDM filter 3, the larger sized filter 3 shifts the projected position of the light reflected at the edge surface 6b toward the left-hand side in FIG. 4C, which may de-couple the reflected light with the PD 4. However, even in this condition, the light multi-reflected within the body of the WDM filter 3 should be taken into consideration, and a portion of the light with the wavelength $\lambda_1$ entering the WDM filer 3 still couples with the surface of the PD 4.

Figure 3:
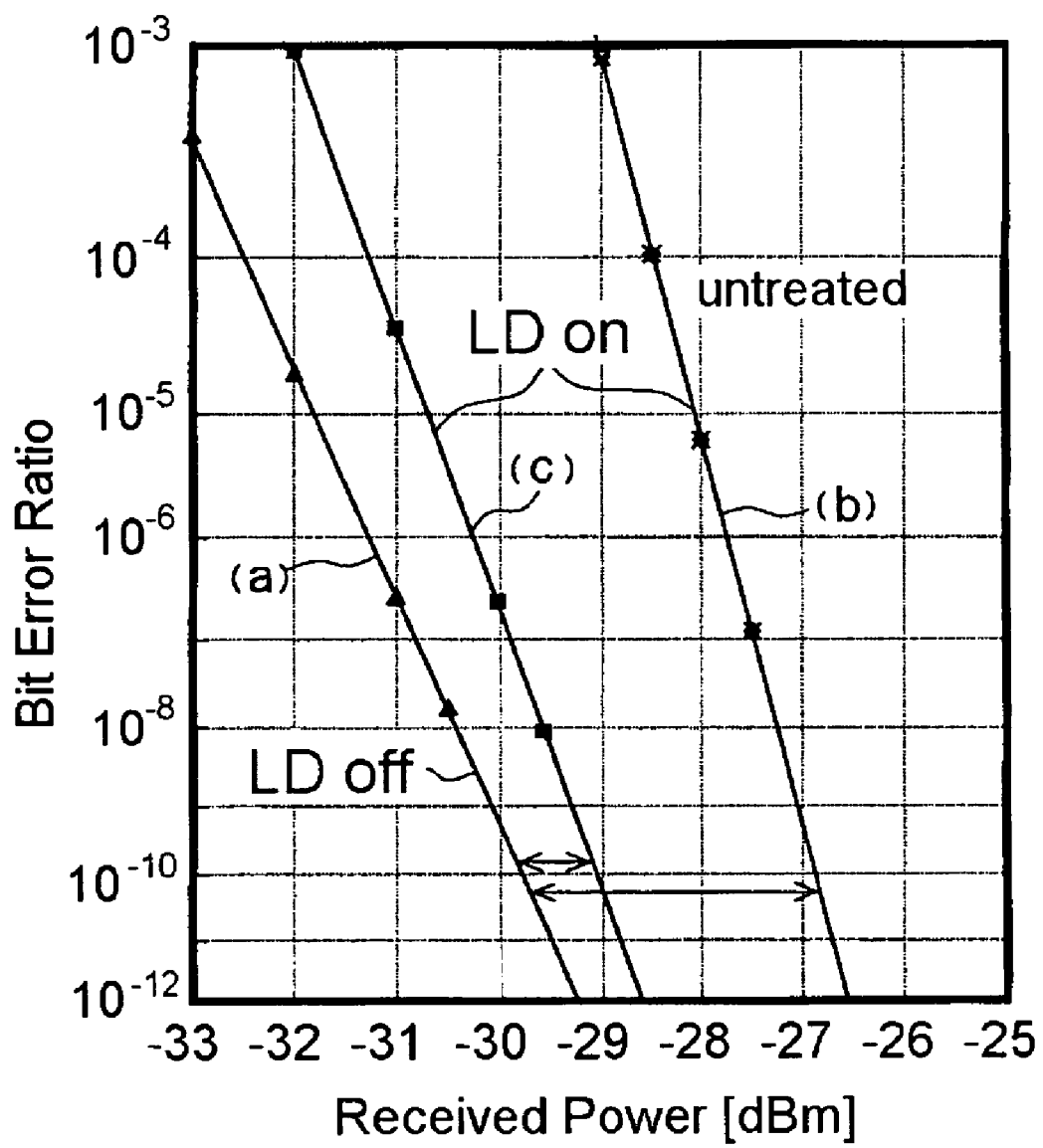
FIG. 3 compares the bit error ratio of the optical module of the present invention with the conventional one.

The optical module according to the present invention, because the WDM filter has a configuration that prevents the light from the LD and reflected at the edge surface from coupling with the PD, the module may improve the optical crosstalk. FIG. 3 exemplarily describes the optical crosstalk characteristic of the present bi-direction module 1. The horizontal axis denotes the received optical power, while, the vertical axis corresponds to the bit error ratio (BER) which directly reflects the crosstalk characteristic.

The behavior A denotes the BER when the module operates only the receiver, that is, the LD emits no light and the completely no optical crosstalk appears. As the optical power decreases from −29.3 to −33 dBm, the BER degrades from $10^{-12}$ to about $5\times10^{-4}$. When the LD is set off, the BER becomes independent of the shape of the edge of the WDM filter 3. The behavior B corresponds to a condition where the LD operates and the WDM filter has the conventional shape in the edge thereof. As the optical power decreases from −26.5 to -about 29.0 dBm, the BER degrades from $10^{-12}$ to $10^{-3}$. The behavior C shows the results of the optical module according to the present invention, in which the edge of the WDM filter makes the obtuse angle with the primary surface. For the behavior C, as the optical power decreases from −28.6 to −32.0 dBm, the BER degrades from $10^{-12}$ to about $10^{-3}$.

Comparing the BER of $10^{-10}$, the crosstalk degrades about 2.8 dBm for the conventional module, while, it degrades only by 0.8 dBm for the optical module according to the invention. The results shown in FIG. 3 may somewhat include an effect of the electrical crosstalk where the electrical output from the PD 4 is affected by the driving signal of the LD. Therefore, another experiment was carried out in which the SMF provided no optical signal and the LD was driven by a DC current to eliminate the electrical crosstalk. For the convention optical module, the PD sensed the light with the power of −43 dB, while the PD in the present optical module sensed the light with the power of −50 dB, which directly reflects the function of the obtusely edge of the WDM filter of the present invention.

While the preferred embodiment of the present invention has been described in detail above, many changes to the embodiment may be made without departing from the true scope and teachings of the present invention. For example, an optically roughed surface, a convex surface, and an anti-reflection coating for the edge of the WDM filter, in addition to the obtusely angled edge of the present invention, and any combination of these arrangement may be applicable to decrease the reflection at the edge of the WDM filter and to reduce the optical coupling between the LD and the PD. The present invention, therefore, is limited only as claimed below and the equivalents thereof.

What is claimed is:

1. A bi-directional optical module that communicates with a single fiber, comprising:
    a semiconductor laser diode to emit first light to said single fiber;
    a semiconductor photodiode to receive second light from said single fiber; and
    a wavelength division multiplexing filter to reflect said first light toward said single fiber and to transmit said second light toward said photodiode, said wavelength division multiplexing filter providing a primary surface to reflect said first light and an edge surface in a side apart from said semiconductor laser diode,
    wherein said edge surface of said wavelength division multiplexing filter makes an obtuse angle with respect to said primary surface, and
    wherein said first light emitted from said semiconductor laser diode and reflected by said edge surface does not enter said semiconductor photodiode.

2. The bi-directional optical module according to claim 1, further comprising a stem having a primary surface that mounts said laser diode, said photodiode and said wavelength division multiplexing filter thereon,
    wherein said wavelength division multiplexing filter is mounted on said stem such that said primary surface of said wavelength division multiplexing filter is inclined by substantially 45° with respect to said primary surface of said stem.

3. The bi-directional optical module according to claim 2, wherein said edge surface of said wavelength division multiplexing filter is substantially in parallel to said primary surface of said stem.

4. The bi-directional optical module according to claim 2, wherein said semiconductor laser diode is mounted on said primary surface of said stem through a sub-mount, and
    wherein an optical axis connecting said semiconductor laser diode with said wavelength division multiplexing filter is substantially in parallel to said primary surface of said stem.

5. The bi-directional optical module according to claim 1, wherein said edge surface of said wavelength division multiplexing filter has an anti-reflection coating.

* * * * *